US008378387B2

(12) United States Patent
Ota et al.

(10) Patent No.: US 8,378,387 B2
(45) Date of Patent: Feb. 19, 2013

(54) FIELD EFFECT TRANSISTOR AND METHOD OF MANUFACTURING THE SAME

(75) Inventors: Kazuki Ota, Tokyo (JP); Yasuhiro Okamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 258 days.

(21) Appl. No.: 12/919,467

(22) PCT Filed: Jan. 21, 2009

(86) PCT No.: PCT/JP2009/050837
§ 371 (c)(1),
(2), (4) Date: Aug. 25, 2010

(87) PCT Pub. No.: WO2009/110254
PCT Pub. Date: Sep. 11, 2009

(65) Prior Publication Data
US 2011/0006345 A1    Jan. 13, 2011

(30) Foreign Application Priority Data

Mar. 4, 2008    (JP) .................................. 2008-053115

(51) Int. Cl.
*H01L 29/78*    (2006.01)
(52) U.S. Cl. ....................................................... 257/192
(58) Field of Classification Search .................. 257/192, 257/E29.089, E21.441; 438/285
See application file for complete search history.

(56) References Cited

U.S. PATENT DOCUMENTS

| 2005/0087765 A1* | 4/2005 | Saito et al. ..................... 257/192 |
| 2005/0274977 A1* | 12/2005 | Saito et al. ..................... 257/192 |
| 2006/0220060 A1* | 10/2006 | Nakata et al. .................. 257/189 |
| 2008/0237610 A1* | 10/2008 | Imanishi et al. ................ 257/77 |

FOREIGN PATENT DOCUMENTS

| JP | 10-270462 A | 10/1998 |
| JP | 2000021899 A | 1/2000 |
| JP | 2006156658 A | 6/2006 |
| JP | 2007165719 A | 6/2007 |
| JP | 2008010803 A | 1/2008 |
| WO | 03071607 A | 8/2003 |

OTHER PUBLICATIONS

International Search Report for PCT/JP2009/050837 mailed Mar. 17, 2009.

* cited by examiner

*Primary Examiner* — Howard Weiss
*Assistant Examiner* — Sue Tang

(57) ABSTRACT

A field effect transistor according to the present invention includes A field effect transistor, comprising: a nitride-based semiconductor multilayer structure, at least including, a drift layer formed of n-type or i-type $Al_xGa_{1-x}N$ ($0 \leq X \leq 0.3$), a barrier layer formed of i-type $Al_yGa_{1-y}$ (Y>X), an electron supply layer formed of n-type $Al_yGa_{1-y}N$, and a channel layer formed of i-type GaN or InGaN, that are epitaxially grown on a substrate in this order, from the side of the substrate, a suitable buffer layer being interposed between the substrate and the nitride-based semiconductor multilayer structure; a gate electrode formed in a part of a front surface of the channel layer with an insulating film interposed therebetween; an $n^+$type connection region in which n-type impurities are doped with the density of $1 \times 10^{18}$ $cm^{-3}$ or more, in a range from at least a part of a channel layer to a part of the drift layer, adjacent to one side in a planer direction of an area where the gate electrode is formed; a source electrode formed on a front surface of the semiconductor layer in the opposite side of the $n^+$type connection region with respect to the gate electrode; and a drain electrode formed on a back surface of the substrate.

11 Claims, 8 Drawing Sheets

ND METHOD
FIELD EFFECT TRANSISTOR AND METHOD OF MANUFACTURING THE SAME

TECHNICAL FIELD

The present invention relates to a field effect transistor using a nitride-based semiconductor and a method of manufacturing the same. Particularly, the present invention relates to a field effect transistor having the constitution that can achieve low on resistance and a method of manufacturing the same in a normally-off (enhancement) type field effect transistor and a method of manufacturing the same.

BACKGROUND ART

A nitride-based semiconductor such as GAN, AlGaN, InGaN, InAlN, InAlGaN has a feature of high insulation breakdown strength, high thermal conductivity, and high electron saturated speed. For this feature, a nitride-based semiconductor material has great potential as a semiconductor material used for the manufacturing a power device for power controlling such as switching elements, or a high frequency device, and in recent years, the practical use development of a field effect transistor using the nitride-based semiconductor material has been actively performed.

For the application as above, the field effect transistor is required to be a normally-off (enhancement) type that does not require a negative direct-current bias power supply to a gate electrode of the field effect transistor. FIG. 8 shows an example of the structure proposed as a normally-off (enhancement) type field effect transistor using a nitride-based semiconductor material (see patent document 1). Hereinafter, the structure of the normally-off type field effect transistor using the nitride-based semiconductor according to the art exemplified in FIG. 8 is briefly described.

A buffer layer 12 and a channel layer 13 formed of i-GaN, for example, are laminated in this order on a semi-insulating substrate 11. On the channel layer 13, a first electron supply layer 14a and a second electron supply layer 14b formed of AlGaN, for example, whose band gap is larger than that of the channel layer 13 are formed to be isolated from each other. Also, on both sides, a pair of contact layers 16a, 16b formed of n-GaN, for example, where n-type impurities such as Si are doped with high density of $5 \times 10^{17}$ cm$^{-3}$ or more are formed. A source electrode S is formed on the contact layer 16a, and a drain electrode D is formed on the contact layer 16b. On the other hand, the surface of the channel layer 13 exposed between the first and the second electron supply layers 14a, 14b is coated with an insulating layer 15. Further, a gate electrode G formed of Ta—Si, for example, is formed, on the insulating layer 15, to form a gate region $G_0$.

Since, in the gate region $G_0$, an electron supply layer does not exist below the gate electrode G, there is no two-dimensional electron gas immediately below the gate electrode G, which is the channel layer 13 located between the first electron supply layer 14a and second the electron supply layer 14b. When a predetermined bias voltage is applied to the gate electrode G, an inversion distribution layer is generated in the channel layer 13 which is located immediately below the insulating layer 15. Because this inversion distribution layer connects between the two dimensions electron gases 6 generated below the first electron supply layer 14a and the second electron supply layer 14b, a drain current flows between the source electrode S and the drain electrode D, and the transistor is on.

On the other hand, neither the two-dimensional electron gas nor the inversion distribution layer is formed, immediately below the gate electrode G when the gate voltage is not biased (Vg=0V), and the two-dimensional electron gases 6 generated below the first electron supply layer 14a and the second electron supply layer 14b are disconnected with each other. Thus, in the state of Vg=0V, the drain current does not flow between the source electrode S and the drain electrode D. That is, the field effect transistor exemplified in FIG. 8 functions as so-called normally-off type transistor in which a drain current does not flow in a state of Vg=0V.

[Patent Document 1]
Domestic Re-publication of PCT International Publication for Patent Application, No. WO 2003/071607

DISCLOSURE OF INVENTION

Technical Problem

On the other hand, there are a plurality of problems assignment as shown below in a normally-off (enhancement) type field effect transistor having the constitution shown in FIG. 8.

The first problem is, since the inversion distribution layer of electrons is used to make the transistor on in the constitution of the gate region $G_0$ shown in FIG. 8, the resistance between the source and the drain in the on state, so-called on resistance become higher.

Generally, high mobility of 1500 cm$^2$/Vs or more is provided when the two dimensions electron gas is formed by AlGaN/GaN heterojunction using an epitaxial layer with relatively high quality currently produced. With the device in which the two dimensions electron gas functions as the carrier to transport current, a field effect transistor of low on resistance can be achieved by the high mobility of the two dimensions electron gas. Since two dimensions electron gas 6 is formed in the channel layer 13 below the first electron supply layer 14a and the second electron supply layer 14b shown in FIG. 8, the resistance of this domain is relatively small.

However, since there is no electron supply layer immediately below the gate region $G_0$, the two-dimensional electron gas is not generated, and the inversion distribution layer of electrons caries out current transportation. It is known that a large number of interface levels exist at the interface between the insulating layer 15 and the channel layer 13 formed of a nitride-based semiconductor, resulting in decrease of electron mobility of the inversion distribution layer. It is difficult to reduce this interface level in the current technique, and the reported electron mobility of the inversion distribution layer is not more than 50 cm$^2$/Vs, which is about $\frac{1}{30}$ of the two dimensions electron gas. That is, in the constitution using the inversion distribution layer of electrons as shown in the gate region $G_0$ of FIG. 8, when a transistor is on, the resistance immediately below the gate, which is so-called channel resistance is 30 times higher than that in the constitution using the two dimensions electron gas, resulting in considerable increase in the on resistance. Particularly, in a power device for electricity, in the products having the pressure resistance of 200 V or less, which is called low pressure resistance product, the channel resistance holds most of the on resistance. Thus, the field effect transistor of FIG. 8 which increases the channel resistance is not suitable as the production of the low pressure resistance product.

To overcome this problem, a gate length (Lg) can be shortened by reducing the distance between the first electron supply layer 14a and the second electron supply layer 14b, to reduce the channel resistance. However, there is a trade-off relation that reducing the gate length (Lg) cause decrease in the drain pressure resistance while it causes decrease in the channel resistance. In this approach, the on resistance cannot be reduced while maintaining high pressure resistance. That is, it is extremely difficult to achieve low on resistance while maintaining enough pressure resistance in the constitution shown in FIG. 8.

The second problem is, since the field effect transistor is a lateral surface device in which both of the source electrode S and the drain electrode D are formed in the semiconductor surface, it is difficult to reduce the on resistance per device area.

As described above, in the constitution shown in FIG. 8, the two dimensions electron gas 6 of high mobility is formed in the channel layer 13 which is below the first electron supply layer 14a and the second electron supply layer 14b. Thus, the area between the source and the gate, and the area between the gate and drain have low resistance. When the area between the gate and the drain is formed with the area having low resistance, is necessary to increase the distance to maintain high gate pressure resistance. For example, the distance between the gate and the drain of around 20 μm is necessary to secure gate pressure resistance of 600 V or more in the field effect transistor of the constitution shown in FIG. 8. Further, the representative dimensions of other region are such that the source electrode is 10 μm, the distance between the source and the gate is 2 μm, the gate length (Lg) is 3 μm, and the drain electrode is 10 μm, which means, among the whole device (45 μm), the distance between the gate and the drain (20 μm) and the drain electrode (10 μm) hold two-thirds.

Thus, the lateral surface device as shown in FIG. 8 requires large distance between the gate and the drain to maintain high gate pressure resistance. Further, the drain electrode needs to be arranged in the semiconductor surface. Thus, the area of these drain regions with respect to the whole device is extremely large. The on resistance of the device is usually defined per device area. Thus, the large area means that the on resistance per device area increases. That is, in the constitution as in FIG. 8, it is difficult to reduce the on resistance of the transistor.

The present invention solves the problems stated above. An object of the present invention is to provide a field effect transistor having the structure that can achieve low power consumption and low on resistance while maintaining high pressure resistance and the method of manufacturing the same, also in, the constitution of normally-off (enhancement) type regarding the field effect transistor using the nitride semiconductor and the method of manufacturing the same.

In shown in FIG. 8, the main factor that reduction of the on resistance is difficult is, first, the normally-off (enhancement) type field effect transistor uses the inversion distribution layer of the low mobility in the channel of the gate region, and second, the normally-off (enhancement) type field effect transistor is a lateral surface device in which reduction of the device area is difficult.

The present inventions have formed it effective to select the following constitution as a means for solving the problems, to accomplish the present invention.

Technical Solution

A field effect transistor according to the present invention includes: a field effect transistor, comprising: a nitride-based semiconductor multilayer structure, at least including, a drift layer formed of n-type or i-type $AlxGa_{1-X}N$ ($0 \leq X \leq 0.3$), a barrier layer formed of i-type $Al_YGa_{1-Y}N$ (Y>X), an electron supply layer formed of n-type $Al_YGa_{1-Y}N$, and a channel layer formed of i-type GaN or InGaN, that are epitaxially grown on a substrate in this order, from the side of the substrate, a suitable buffer layer being interposed between the substrate and the nitride-based semiconductor multilayer structure; a gate electrode formed in a part of a front surface of the channel layer with an insulating film interposed therebetween; an n+type connection region in which n-type impurities are doped with the density of $1 \times 10^{18}$ cm$^{-3}$ or more, in a range from at least a part of a channel layer to a part of the drift layer, adjacent to one side in a planer direction of an area where the gate electrode is formed; a source electrode formed on a front surface of the semiconductor layer in the opposite side of the n+type connection region with respect to the gate electrode; and a drain electrode formed on a back surface of the substrate.

A method of manufacturing a field effect transistor according to the present invention include a method of mean manufacturing a field effect transistor, comprising: forming a nitride-based semiconductor multilayer structure by epitaxially growing, on a substrate, at least a drift layer formed of n-type or i-type $AlxGa_{1-X}N$ ($0 \leq X \leq 0.3$), a barrier layer formed of i-type $Al_YGa_{1-Y}N$ (Y>X), an electron supply layer formed of n-type $Al_YGa_{1-Y}N$, and a channel layer formed of i-type GaN or InGaN, in this order, from the side of the substrate, a suitable buffer layer being interposed between the substrate and the nitride-based semiconductor multilayer structure; forming a gate electrode in a part of a front surface of the channel layer with an insulating film interposed therebetween; forming an n+type connection region in which n-type impurities are doped with the density of $1 \times 10^{18}$ cm$^{-3}$ or more, in a range from at least a part of the channel layer to a part of the drift layer, adjacent to one side in a planer direction of an area where the gate electrode is formed; forming a source electrode on a front surface of the semiconductor layer in the opposite side of the n+type connection region with respect to the gate electrode; and forming a drain electrode on a back surface of the substrate.

Advantageous Effects

According to the present invention, regarding the field effect transistor using the nitride semiconductor, it is possible to provide a field effect transistor having the structure that can achieve low power consumption and low on resistance while maintaining high pressure resistance and the method for manufacturing the same also in the constitution of the normally-off (enhancement) type.

EXPLANATION OF REFERENCE

Figure 1:
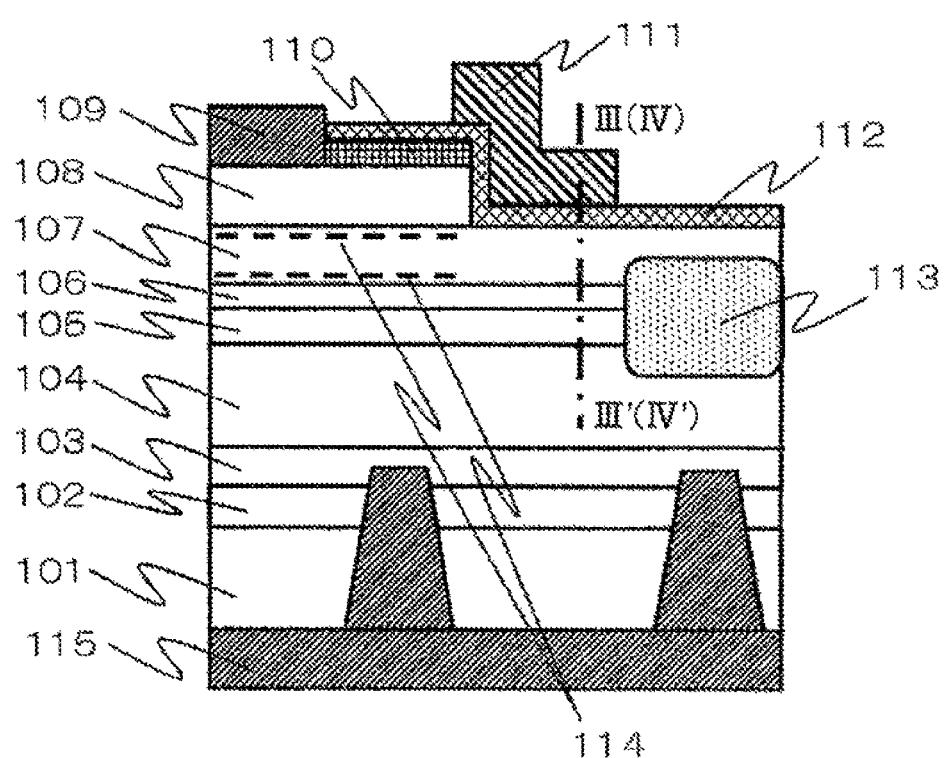
FIG. 1 is a schematic cross sectional view of an example of the configuration of a field effect transistor according to a first exemplary embodiment of the present invention.

101 SUBSTRATE
102 BUFFER LAYER
103 DRAIN CONTACT LAYER
104 DRIFT LAYER
105 BARRIER LAYER
106 ELECTRON SUPPLY LAYER
107 CHANNEL LAYER
108 SOURCE CONTACT LAYER
109 SOURCE ELECTRODE
110 PROTECTIVE FILM
111 GATE ELECTRODE
112 GATE INSULATING FILM
113 N+TYPE CONNECTION REGION
114 TWO-DIMENSIONAL ELECTRON GAS
115 DRAIN ELECTRODE
116 INVERSION LAYER
201 SUBSTRATE
202 BUFFER LAYER
204 DRIFT LAYER
205 BARRIER LAYER
206 ELECTRON SUPPLY LAYER
207 CHANNEL LAYER
209 SOURCE ELECTRODE
210 PROTECTIVE FILM
211 GATE ELECTRODE
212 GATE INSULATING FILM
213 N+ TYPE CONNECTION REGION
215 DRAIN ELECTRODE
216 SOURCE CONTACT DOMAIN
217 DIFFUSION SOURCE

BEST MODE FOR CARRYING OUT THE INVENTION

A field effect transistor according to the present invention has a nitride-based semiconductor multilayer structure that is epitaxially grown on a substrate with a suitable buffer layer interposed therebetween. Further, the nitride-based semiconductor multilayer structure is forward by laminating at least a drift layer formed of n-type or i-type $AlxGa_{1-x}N(0 \leqq X \leqq 0.3)$, barrier layer comprising of i-type $Al_YGa_{1-Y}N$ (Y>X), an electron supply layer formed of n-type $Al_YGa_{1-Y}N$, and a channel layer formed of i-type GaN or InGaN in this order, from the side of the substrate. A gate electrode is formed in a part of a front surface of the channel layer with an insulating film interposed therebetween. Moreover, an n+type connection region is formed in which n-type impurities are doped with the density of $1 \times 10^{18}$ cm$^{-3}$ or more, in a range from at least a part of the channel layer to a part of the drift layer, adjacent to one side in a planer direction of an area where the gate electrode is formed. A source electrode is formed on a front surface of the semiconductor layer in the opposite side of the n+type connection region with respect to the gate electrode. In addition, a drain electrode is formed on a back surface of the substrate.

Thus, in the field effect transistor according to the present invention, the electron supply layer is formed on the opposite side with respect to the gate electrode formed on the surface of the channel layer with an insulating film interposed therebetween, which is below the channel layer. Thus, when the predetermined bias voltage is applied to the gate electrode to turn on the transistor, the two dimensions electron gas having high mobility is accumulated at the interface between the channel layer and the electron supply layer in addition to the inversion distribution layer of electrons formed at the interface between the insulating film and the channel layer immediately below the gate. That is, while the current transport immediately below the gate electrode is carried out with only the inversion distribution layer of the electrons having low mobility in the normally-off type field effect transistor shown in FIG. 8, the current transport immediately below the gate electrode is carried out by the inversion distribution layer and the two-dimensional electron gas in the present invention. The channel resistance can be greatly reduced by two points that the carriers increase since the two dimensions electron gas is added to the inversion distribution layer and that the mobility of the two dimensions electron gas which is newly added is high.

Further, according to the present invention, the vertical transistor structure is employed between the gate and the drain is employed in which the electron flows to the drain electrode of the back surface of the substrate from the channel layer through the n+type connection region and the drift layer. Thus, the pressure resistance of the transistor is determined based on the thickness of the drift layer and the n-type impurity density. It is necessary to increase the distance between the gate and the drain to sufficiently increase the pressure resistance of the transistor. When the distance between the gate and the drain is increased in the lateral surface device, the area of the device increases. On the other hand, in the vertical transistor according to the present invention, the area of the device does not change even if, for example, the thickness of the drift layer is increased to keep the high pressure resistance. Further, since the drain electrode is formed on the back surface of the substrate, the device area is less than half of the lateral surface device; therefore, the on resistance per device area can be greatly reduced.

Further, according to the present invention, when the predetermined bias voltage is applied to the gate electrode to turn on the transistor, the two dimensions electron gas is also accumulated on the interface between the AlGaN barrier layer and the GaN drift layer immediately below the gate electrode. As a result, the effect is obtained that the flow of electrons spreads laterally through the two-dimensional electron gas at the interface between the barrier layer and the drift layer when electrons are injected in the drift layer from the n+type connection region. In the lateral surface device, the cross section of current paths does not spread in this way in the drift region between the gate and the drain. Accordingly, by employing the vertical transistor structure according to the present invention, the resistance of the drift region decreases in comparison with the lateral surface device, resulting in an increase in the on resistance.

As discussed above, even if the field effect transistor according to the present invention has the constitution of normally-off (enhancement) type, it is possible to achieve low on resistance and low power consumption while maintaining high pressure resistance.

The present invention will be described in detail with the examples shown below. The following description is merely one example of the best embodiment of the present invention, and the present invention is not limited to these exemplary embodiments.

First Exemplary Embodiment

The embodiment of a field effect transistor according to a first exemplary embodiment of the present invention is described with reference to the drawings in detail. FIG. 1 is a schematic cross sectional view of the constitution of the field effect transistor according to the first exemplary embodiment of the present invention.

A nitride semiconductor used in the field effect transistor according to the first exemplary embodiment has the following layered structure. On a substrate 101, a buffer layer 102, a drain contact layer 103 formed of n-type GaN where Si is doped by $2\times10^{19}$ cm$^3$ with the thickness of 0.1 µm, a drift layer 104 comprising GaN having the thickness of 2.5 µm, a barrier layer 105 comprising undope $Al_{0.15}Ga_{0.85}N$ having the thickness of 15 nm, an electron supply layer 106 comprising n-type $Al_{0.15}Ga_{0.85}N$ where Si is doped by $1\times10^{19}$ cm$^3$ with the thickness of 5 nm, a channel layer 107 comprising undoped GaN having the thickness of 10 nm, and a source contact layer 108 comprising n-type $Al_{0.2}Ga_{0.8}N$ where Si is doped by $1\times10^{18}$ cm$^3$ with the thickness of 15 nm are epitaxially grown in this order, to form a layered structure. Note that the source contact layer 108 is formed of n-type $Al_{0.2}Ga_{0.8}N$, but it may be formed of n-type or i-type $Al_ZGa_{1-Z}N$ (Z>Y). A part of the source contact layer 108 on the surface is etched and removed, and a source electrode 109 and a protective film 110 are formed in the domain where the source contact layer 108 remains. A gate insulating film 112 is formed to cover the protective film 110 and a region where the source contact layer 108 was etched and removed. On the gate insulating film 112, a gate electrode 111 is formed to cover an end of the source contact layer 108. An n+type connection region 113 where the Si as n-type impurities is doped by $1\times10^{19}$ cm$^{-3}$ or more is formed from a part of the channel layer 107 to a part of the drift layer 104 in the domain opposite to the source electrode 109 with respect to the gate electrode 111. A trench ditch that reaches the drain contact layer 103 is formed on the rear surface of the substrate 101, and a drain electrode 115 is formed to cover this trench ditch and the back surface of the substrate 101.

An example of a method for manufacturing of the field effect transistor of FIG. 1 is described with reference to FIG. 2A to FIG. 2F. FIG. 2A to FIG. 2F each show a schematic cross sectional view showing a manufacturing process of the field effect transistor according to the first exemplary embodiment of the present invention.

Figure 2A:
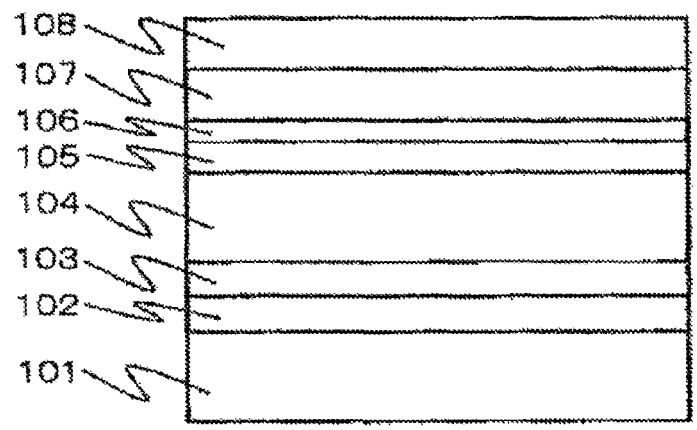
FIG. 2A is a schematic cross sectional view describing an epitaxial growth process in a manufacturing process of the field effect transistor according to the first exemplary embodiment of the present invention.

At first, using the organic metal vapor phase epitaxy method (MOVPE: Metal Organic Vapor Phase Epitaxy), on the substrate 101 comprising SiC, the buffer layer 102, the drain contact layer 103 comprising n-type GaN where Si is doped by $2\times10^{19}$ cm$^{-3}$ with the thickness 0.1 µm, the drift layer 104 comprising GaN having the thickness of 2.5 µm, the barrier layer 105 comprising undope $Al_{0.15}Ga_{0.85}N$ having the thickness of 15 nm, the electron supply layer 106 comprising n-type $Al_{0.15}Ga_{0.85}N$ where Si is doped by $1\times10^{19}$ cm$^{-3}$ with the thickness of 5 nm, channel layer 107 comprising undope GaN having the thickness of 10 nm, and the source contact layer 108 comprising n-type $Al_{0.2}Ga_{0.8}N$ where Si is doped by $1\times10^{18}$ cm$^{-3}$ with the thickness of 15 nm are epitaxially grown in this order, to form the layered structure of the nitride semiconductor used for manufacturing (FIG. 2A).

Figure 2B:
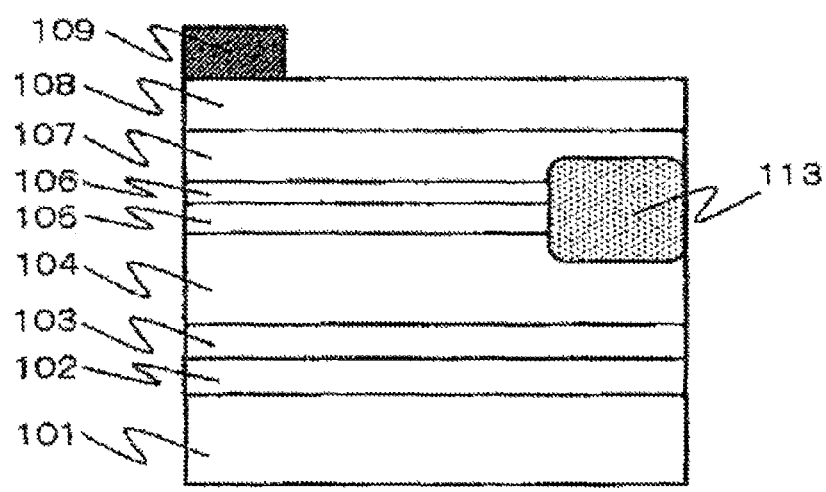
FIG. 2B is a schematic cross sectional view describing a forming process of an n+type connection region and a source electrode in the manufacturing process of the field effect transistor according to the first exemplary embodiment of the present invention.

Then, using a photoresist mask having an opening pattern formed in the domain where the n+type connection region 113 is formed, Si of $1\times10^{15}$ cm$^{-2}$ is injected with the energy of 70 keV by an ion implantation method in the predetermined place. Then the photoresist mask is removed, and annealing is performed at 1200 degrees Celsius, to form the n+type connection region 113. Then, after forming Ti/Al (30/180 nm) electrode at the predetermined place of the surface of the source contact layer 108 using the vapor deposition/liftoff method, RTA (Rapid Thermal Anneal) is performed at 700 degrees Celsius for 60 seconds, to obtain the source electrode 109 (FIG. 2B).

Figure 2C:
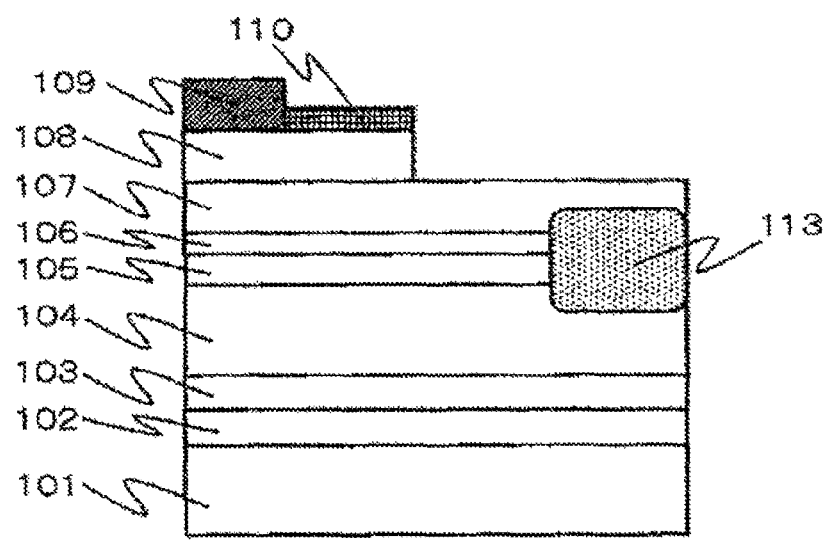
FIG. 2C is a schematic cross sectional view describing an etching process of a source contact layer in the manufacturing process of the field effect transistor according to the first exemplary embodiment of the present invention.

By a plasma CVD (Chemical Vapor Deposition) method, the protective film 110 formed of SiN having the thickness of 100 nm is formed. Then, using the photoresist mask having an aperture pattern formed in the domain where the source contact layer 108 is removed, the protective film 110 is etched using a RIE (Reactive Ion Etching) method. After removing the photoresist mask, the source contact layer 108 is etched and removed using the protective film 110 as the etching mask, using an ICP (Inductively Coupled Plasma) dry etch method (FIG. 2C).

Figure 2D:
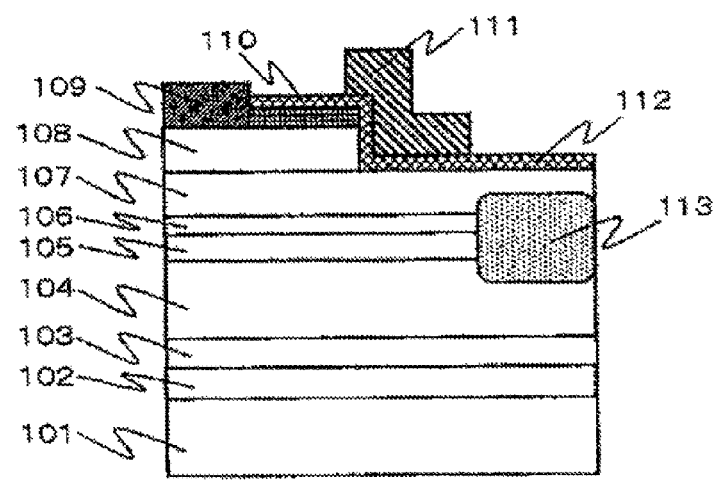
FIG. 2D is a schematic cross sectional view describing a forming process of a gate insulating film and a gate electrode in the manufacturing process of the field effect transistor according to the first exemplary embodiment of the present invention.
Figure 2E:
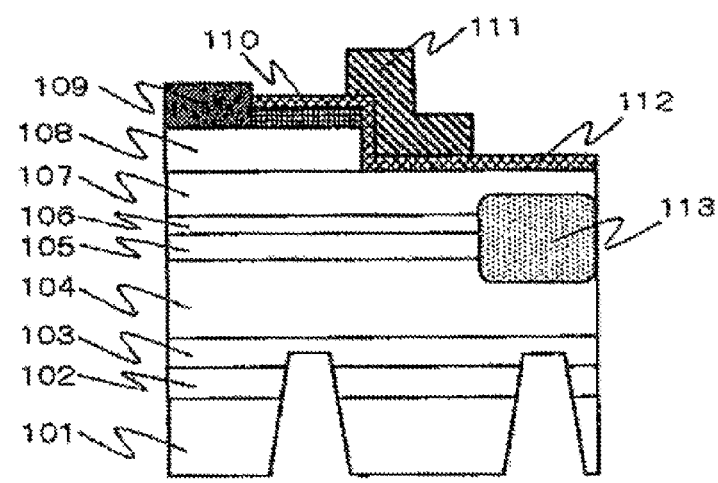
FIG. 2E is a schematic cross sectional view describing a process to form a trench groove on a back surface of the substrate in the manufacturing process of the field effect transistor according to the first exemplary embodiment of the present invention.
Figure 2F:
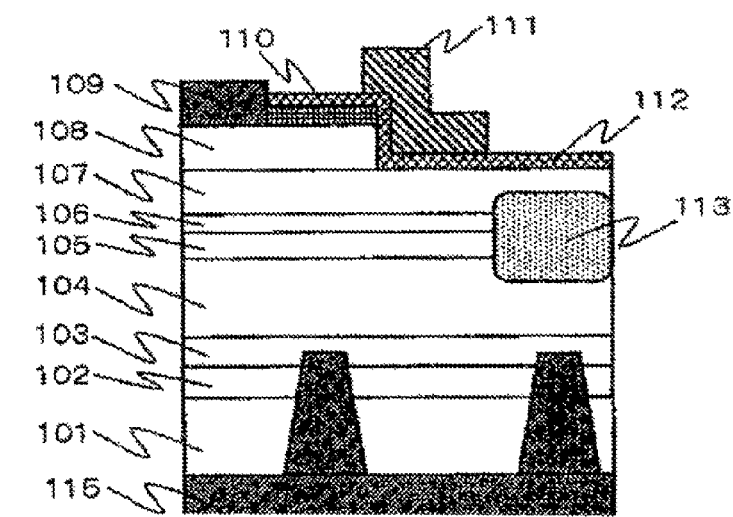
FIG. 2F is a schematic cross sectional view describing the forming process of the drain electrode in the manufacturing process of the field effect transistor according to the first exemplary embodiment of the present invention.

By an ALD (Atomic Layer Deposition) method, the gate insulating film 112 comprising Al$_2$O$_3$ having the thickness of 30 nm is layered. Then, the gate electrode 111 is obtained by forming Ni/Au (30/300 nm) in the predetermined place using the vapor deposition/liftoff method (FIG. 2D). After polishing the back surface of the substrate 101 to achieve the thickness of 120 µm, the ICP (Inductively Coupled Plasma) dry etch method is performed using a metal mask comprising Ni having an aperture pattern formed in the predetermined place. Thus, a trench ditch that penetrates through the substrate 101 and the buffer layer 102 and reaches the drain contact layer 103 is formed (FIG. 2E). Finally a field effect transistor is completed by forming the drain electrode 115 by the vapor deposition method in the whole of the back surface of the substrate 101 (FIG. 2F).

Figure 3:
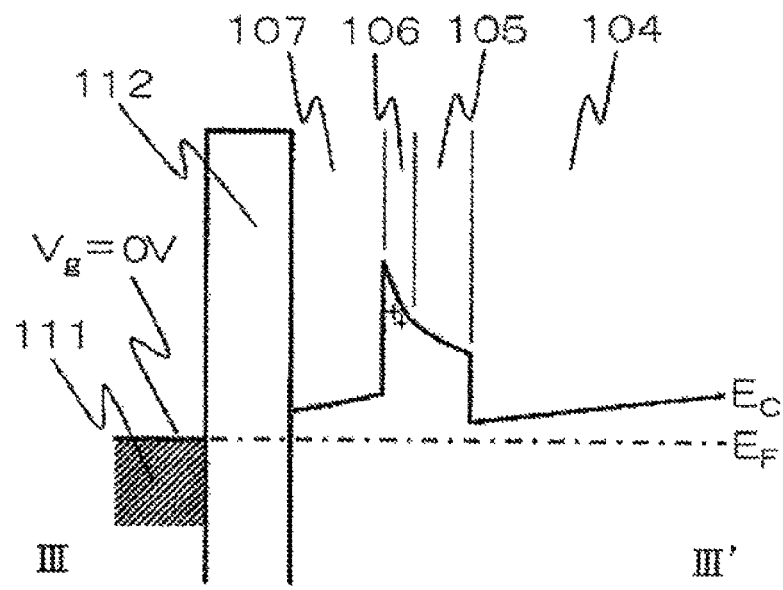
FIG. 3 is an energy potential distribution diagram showing conduction band energy under the gate electrode with the off state in the field effect transistor according to the first exemplary embodiment of the present invention.
Figure 4:
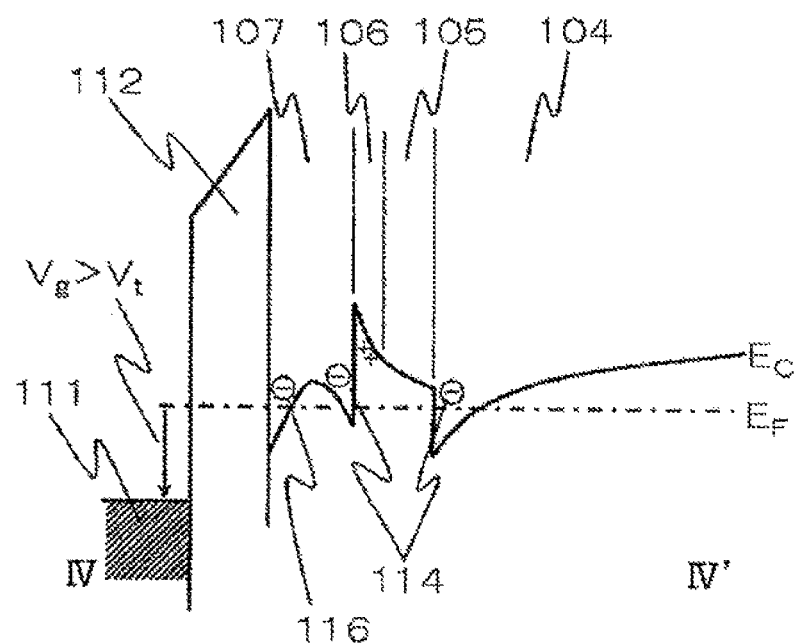
FIG. 4 is an energy potential distribution diagram showing conduction band energy under the gate electrode with the on state in the field effect transistor according to the first exemplary embodiment of the present invention.

Then, the operation of the field effect transistor of FIG. 1 is described with reference to FIG. 3 to FIG. 5. FIG. 3 and FIG. 4 each show an energy potential distribution diagram taken along the line of III (IV)-III' (IV') of FIG. 1. FIG. 3 shows energy potential distribution when bias voltage is not applied to the gate electrode 111 (Vg=0V). FIG. 4 shows energy potential distribution when the positive bias voltage that is equal to or larger than the predetermined threshold voltage (Vt) is applied to the gate electrode 111 (Vg>Vt>0V).

In the field effect transistor of FIG. 1, when the bias voltage is not applied to the gate electrode 111 (Vg=0V), as shown FIG. 3, the energy (EC) of the conduction band is not below the Fermi level (EF) for the whole channel layer 107, which means there is no electron that functions as the carrier. That is, in FIG. 1, at Vg=0V, a two-dimensional electron gas 114 generated in the domain where the source contact layer 108 is formed and the n$^+$type connection region 113 are disconnected. Thus, this field effect transistor is in the off state in which the electric current does not flow between the source electrode 109 and the drain electrode 115.

On the other hand, when positive bias voltage that is equal to or higher than the predetermined threshold voltage (Vt) is applied to the gate electrode 111 (Vg>Vt>0V), the energy (EC) of the conduction band is reduced, as shown FIG. 4. Then the energy (EC) of the conduction band becomes below the Fermi level (EF) at three points: the interface between the channel layer 107 and the gate insulating film 112, the interface between the channel layer 107 and the electron supply layer 106, and the interface between the barrier layer 105 and the drift layer 104. Herewith, an electron which functions as the carrier is accumulated as the inversion distribution layer 116 at the interface between the channel layer 107 and the gate insulating film 112 and as the two-dimensional electron gas 114 at the other two interfaces. That is, when positive bias voltage that is equal to or higher than the predetermined threshold voltage (Vt) is applied to the gate electrode 111 (Vg>Vt>0V), this field effect transistor is in the on state in which electric current flows between the source electrode 109 and the drain electrode 115. This is because inversion layer 116 and the two-dimensional electron gas 114 which are generated in the channel layer 107 connect the two-dimensional electron gas 114 generated in the domain where the source contact layer 108 is formed and the n$^+$type connection region 113.

Figure 5:
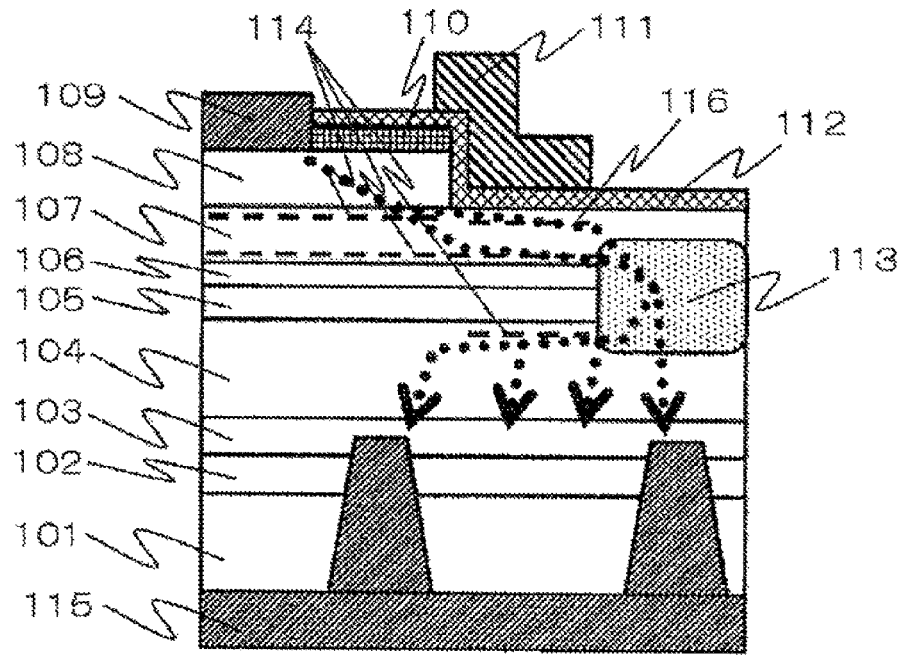
FIG. 5 is a cross sectional view describing a flow of electrons that are carriers with the on state in the field effect transistor according to the first exemplary embodiment of the present invention.

FIG. 5 is a cross sectional view describing a flow of electrons that are carriers with the on state in the field effect transistor, when the positive bias voltage that is equal to or higher than the predetermined threshold voltage (Vt) is applied (Vg>Vt>0V) to the gate electrode 111 of the field effect transistor of FIG. 1. As discussed above, the population inversion layer 116 and the two-dimensional electron gas 114 are generated within the channel layer 107 immediately below the gate electrode 111 when the field effect transistor is in the on state. Thus, the two-dimensional electron gas 114 generated in the domain where the source contact layer 108 is formed and the n$^+$type connection region 113 are connected. Therefore, as shown in the dotted line arrow of FIG. 4, the electron injected from the source electrode 109 on the surface into the semiconductor layer moves through the n$^+$type connection region 113 from the source contact layer 108 and the channel layer 107, and from here, flows to the drain electrode 115 of the back surface from the drift layer 104 and the drain contact layer 103 in the vertical direction.

As described above, the field effect transistor of the present invention of FIG. 1 is in the off state in which the current does not flow between the source electrode 109 and the drain electrode 115 when the bias voltage is not applied to the gate electrode 111 (Vg=0V). The field effect transistor is in the on state only when the positive bias voltage that is equal to or higher than the predetermined threshold voltage (Vt) is applied (Vg>Vt>0V), and the current flows between the source electrode 109 and the drain electrode 115. That is, the field effect transistor of the present invention of FIG. 1 functions as a normally-off (enhancement) type field effect transistor. Also, the field effect transistor of the present invention of FIG. 1 functions as a vertical field effect transistor in which the flow of electrons (current) in the on state is vertical from the source electrode 109 on the front surface to the drain electrode 115 of the back surface.

When the field effect transistor of the present invention of FIG. 1 is in the on state in which the positive bias voltage that is equal to or higher than the predetermined threshold voltage (Vt) is applied to the gate electrode 111 (Vg>Vt>0V), the two-dimensional electron gas 114 having high mobility is accumulated at the interface between the channel layer 107 and the electron supply layer 106 in addition to the inversion distribution layer 116 accumulated at the interface between the channel layer 107 and the gate insulating film 112, in the channel layer 107 of the domain below the gate electrode 111, as shown in FIG. 4 and FIG. 5. That is, while the current transport immediately below the gate electrode is carried out with only the inversion distribution layer of the electrons having low mobility while in the normally-off type field effect transistor shown in FIG. 8, the current transport immediately below the gate electrode 111 is carried out by the inversion distribution layer 116 and the two-dimensional electron gas 114 in the present invention. Thus, in the present invention, the two-dimensional electron gas 114 is added to the inversion distribution layer 116 to increase the carriers, and mobility of the two-dimensional electron gas 114 which is newly added is high. Therefore the channel resistance can be substantially reduced.

Also, the field effect transistor of the present invention has the vertical transistor structure in which the electron flows to the drain electrode 115 of the back surface of the substrate from the channel layer 107 through the n$^+$type connection region 113 and the drift layer 104, from the domain below the gate electrode 111 toward the drain electrode 115, as shown in FIG. 5. Therefore, the pressure resistance of the transistor is determined based on the thickness of the drift layer 104 and the n-type impurity density. Also, it is necessary to increase the distance between the gate and the drain to sufficiently increase the pressure resistance of the transistor. When the distance between the gate and the drain is increased in the lateral surface device, the area of the device increases. On the other hand, in the vertical transistor according to the present invention, for example, even if the thickness of the drift layer 104 is increased to keep the high pressure resistance, the area of the device does not change. Furthermore, since the drain electrode 115 is formed in the back surface of the substrate, a device area can be reduced with respect to a lateral surface device. For example, in the field effect transistor according to the exemplary embodiment of the invention, withstand pressure of 600 V can be obtained by forming the drift layer 104 in undope GaN with the thickness of 2.5 μm. Also, in the field effect transistor according to the exemplary embodiment of the invention, representative dimensions of each domain are such that the source electrode is 10 μm, the distance between the source and the gate is 2 μm, the gate length (Lg) is 3 μm, the n$^+$type connection region is 3 μm, which means the total of 18 μm. Thus, the device area can be reduced by 60% compared with the dimensions (45 μm) of the lateral surface device.

Further, as shown in FIG. 4 and FIG. 5, in the field effect transistor of the present invention, the two-dimensional electron gas 114 is accumulated also at the interface between the drift layer 104 and the barrier 105 below the gate electrode 111 when the predetermined bias voltage is applied to the gate electrode 111 to turn on the transistor. As a result, the effect is obtained that the flow of the electrons (current) spreads laterally through the two-dimensional electron gas 114 at the interface between the barrier layer 105 and the drift layer 104, when the electron is poured into the drift layer 104 from the n$^+$type connection region 113. In the lateral surface device, the cross section of current paths does not spread in this way in the drift region between the gate and the drain. Accordingly, by employing the vertical transistor structure according to the present invention, the resistance of the drift region decreases in comparison with the lateral surface device, resulting in an increase in the On resistance.

Figure 8:
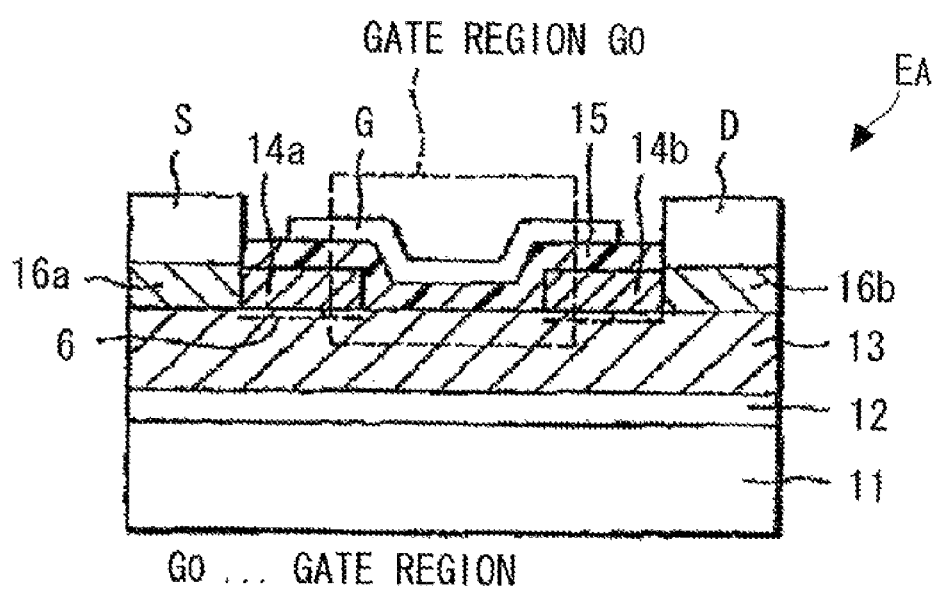
FIG. 8 is a schematic cross sectional view of an example of the constitution of a related normally-off (enhancement) type field effect transistor.

As described above, the field effect transistor of the present invention of FIG. 1 is able to reduce the channel resistance, the device area, and the resistance of the drift region compared with the field effect transistor shown in FIG. 8, resulting in the extremely small value of the On resistance of 3 mΩcm$^2$ with respect to the pressure resistance of 600 V.

Note that the materials and the manufacturing process shown in the present exemplary embodiment are merely an example, and they are not limited to this. For example, the substrate 101 may be formed by other materials than SiC, e.g., sapphire, GaN, and Si, as long as it allows a nitride-based semiconductor to be grown epitaxially. Further, SiO$_2$, SiN, SiON, AlN, MgO, Sc$_2$O$_3$, ZrO$_2$, HfO$_2$, and layered structures thereof can be used as the gate insulating film 112 as well as Al$_2$O$_3$. Also, the impurities addition method such as the solid layer diffusion may be employed as the formation method of the n$^+$type connection region 113 as well as the ion implantation method.

Second Exemplary Embodiment

Figure 6:
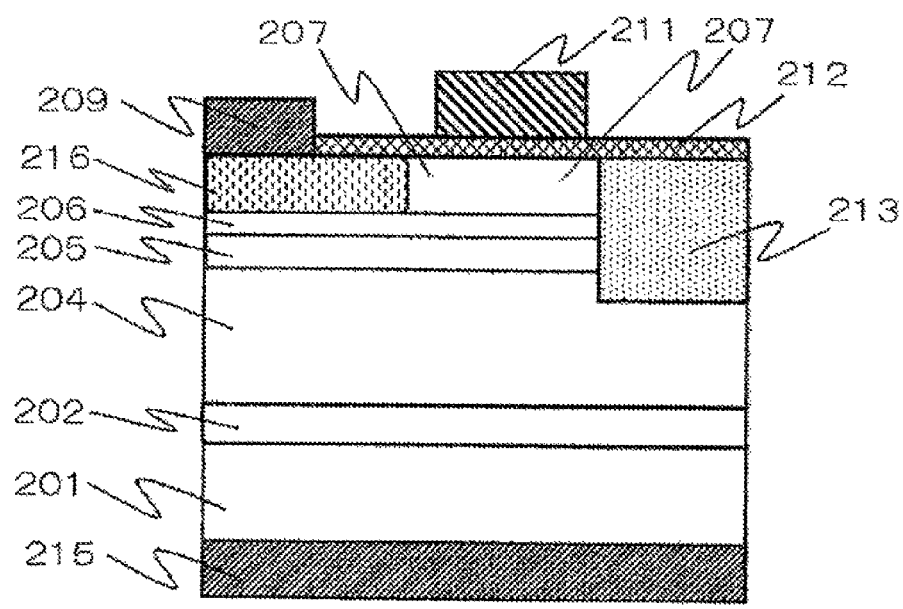
FIG. 6 is a schematic cross sectional view of an example of the constitution of a field effect transistor according to a second exemplary embodiment of the present invention.

The embodiment of a field effect transistor according to a second exemplary embodiment of the present invention is described with reference to the drawings in detail. FIG. 6 is a schematic cross sectional view of the constitution of the field effect transistor according to the second exemplary embodiment.

A nitride semiconductor used in the field effect transistor according to the second embodiment has the following layered structure. On a substrate 201, a buffer layer 202, a drift layer 204 comprising Al$_{0.03}$Ga$_{0.97}$N having the thickness of 1 μm, a barrier layer 205 comprising undope Al$_{0.2}$Ga$_{0.8}$N having the thickness of 15 nm, an electron supply layer 206 comprising n-type Al$_{0.2}$Ga$_{0.8}$N where Si is doped by 1×10$^{19}$ cm$^3$ with the thickness 5 nm, and a channel layer 207 comprising undope In$_{0.05}$Ga$_{0.95}$N having the thickness of 10 nm, are pitaxially grown in this order, to form the layered structure. A source contact domain 216 where Si is doped by 2×10$^{19}$ cm$^{-3}$ or more as n-type dopant is formed in a part of the channel layer 207 on the surface. Although Si as n-type impurities is doped with the density of 2×10$^{19}$ cm$^{-3}$ or more in the source contact domain 216, it is sufficient that the n-type impurities are doped with the density of 2×10$^{18}$ cm$^{-3}$ or more. Further, a source electrode 209 is formed on the source contact domain 216. A gate insulating film 212 is formed on the surface of the channel layer 207. A gate electrode 211 is formed to be adjacent to the source contact domain 216 on the surface of the gate insulating film 212. An n$^+$type connection region 213 where Si is doped by 2×10$^{19}$ cm$^{-3}$ or more is formed in the domain opposite to the source electrode 209 with respect to the gate electrode 211 for a part of the drift layer 204 from the channel layer 207. A drain electrode 215 is formed on the back surface of the substrate 201.

An example of the manufacturing method of the field effect transistor of FIG. 6 is described with reference to FIG. 7A to FIG. 7F. FIG. 7A to FIG. 7F each show a schematic cross sectional view showing the manufacturing process of the field effect transistor according to the second exemplary embodiment of the present invention.

Figure 7A:
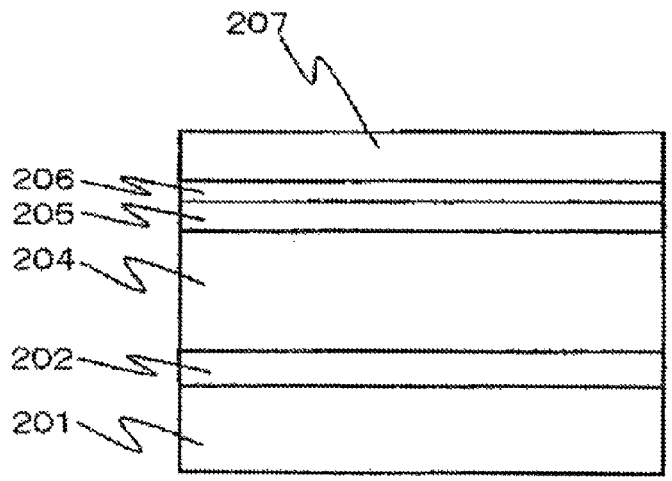
FIG. 7A is a schematic cross sectional view describing an epitaxial growth process in a manufacturing process of the field effect transistor according to the second exemplary embodiment of the present invention.
Figure 7B:
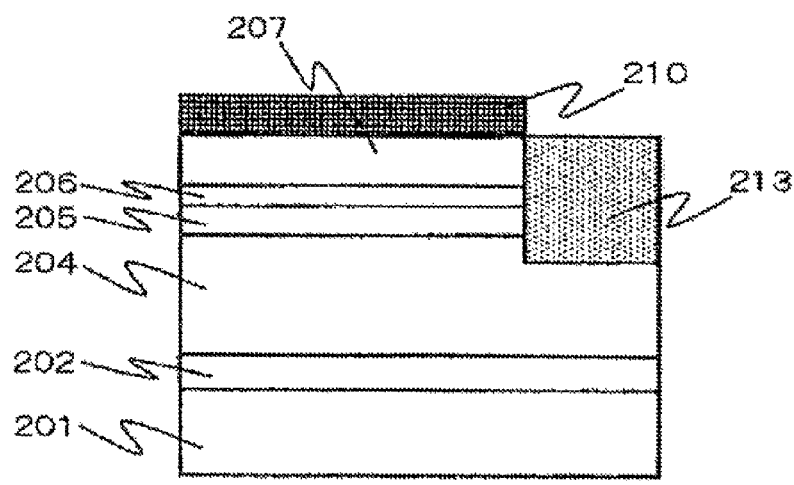
FIG. 7B is a schematic cross sectional view describing a forming process of an n+type connection region in the manufacturing process of the field effect transistor according to the second exemplary embodiment of the present invention.

At first, using the organic metal vapor phase epitaxy method (MOVPE: Metal Organic Vapor Phase Epitaxy), on the substrate 201 comprising n-type Si, the buffer layer 202, the drift layer 204 comprising n-type Al$_{0.03}$Ga$_{0.97}$N where Si is doped 1×10$^{16}$ cm$^3$ with the thickness of 1 μm, the barrier layer 205 comprising undope Al$_{0.2}$Ga$_{0.8}$N having the thickness of 15 nm, the electron supply layer 206 comprising n-type Al$_{0.2}$Ga$_{0.8}$N where Si is doped by 1×10$^{19}$ cm$^3$ with the thickness of 5 nm, and the channel layer 207 comprising undope In$_{0.05}$Ga$_{0.95}$N with the thickness of 10 nm, are epitaxially grown in this order, to form the layered structure of the nitride semiconductor used for manufacturing (FIG. 7A).

Next, by the heat CVD (Chemical Vapor Deposition) method, an protective film 210 comprising SiO$_2$ having the thickness of 200 nm is formed. Using a photoresist mask having an aperture pattern formed in the domain where the n$^+$type connection region 213 is formed, the protective film 210 is etched using the RIE (Reactive Ion Etching) method. Further, after removing the photoresist mask, using the protective film 210 as a mask, the channel layer 207, the electron supply layer 206, the barrier 205, and a part of the drift layer 204 are etched using the ICP (Inductively Coupled Plasma) dry etch method. Then, by the selective growth using the organic metal vapor phase epitaxy method, the n$^+$type connection region 213 is obtained (FIG. 7B) by filling the cavity obtained by etching with the n$^+$type GaN where Si is doped by 2×10$^{19}$ cm$^3$.

Figure 7C:
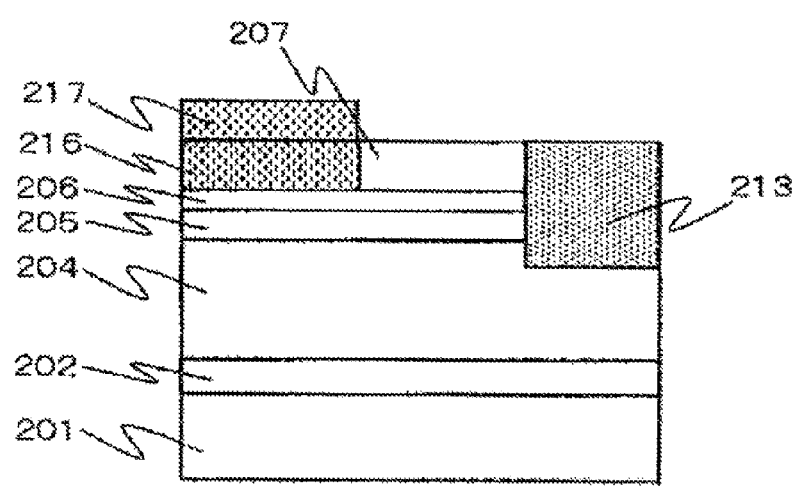
FIG. 7C is a schematic cross sectional view describing a forming process of a source contact domain in the manufacturing process of the field effect transistor according to the second exemplary embodiment of the present invention.

After the protective film 210 is etched and removed, by the plasma CVD (Chemical Vapor Deposition) method, a diffusion source 217 comprising SiON having the thickness of 100 nm is formed. Then, the diffusion source 217 is etched and removed using the RIE method, in the region other than the domain where the source contact domain 216 is formed, using the photoresist mask having an aperture pattern formed. Successively, Si is diffused in solid layer into the channel layer 207 from the diffusion source 217 by performing annealing at 1000 degrees Celsius for 30 minutes, whereby the source contact domain 216 is obtained (FIG. 7C).

Figure 7D:
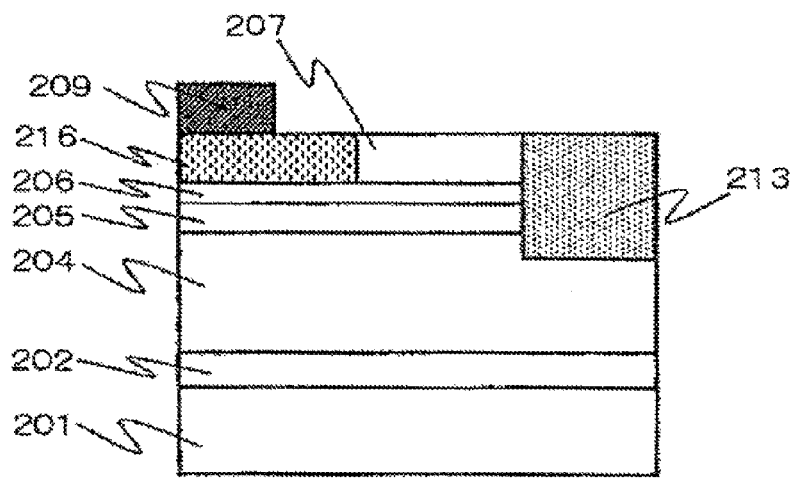
FIG. 7D is a schematic cross sectional view describing a forming process of a source electrode in the manufacturing process of the field effect transistor according to the first exemplary embodiment of the present invention.
Figure 7E:
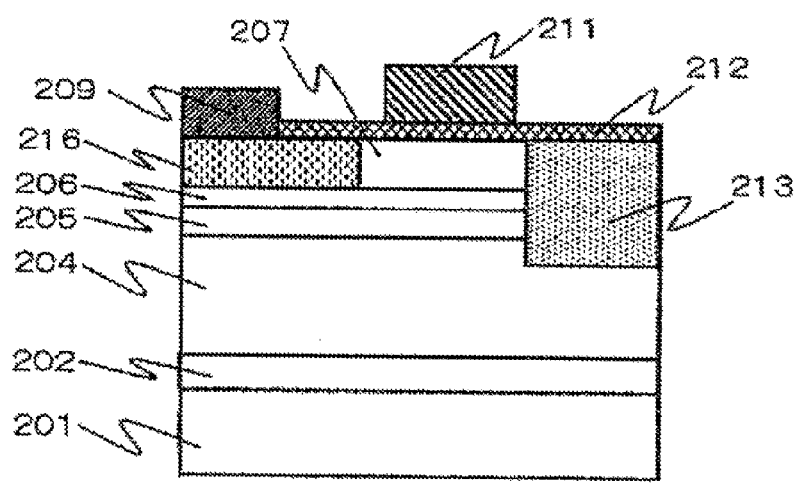
FIG. 7E is a schematic cross sectional view describing a forming process of a gate insulating film and a gate electrode in the manufacturing process of the field effect transistor according to the first exemplary embodiment of the present invention.
Figure 7F:
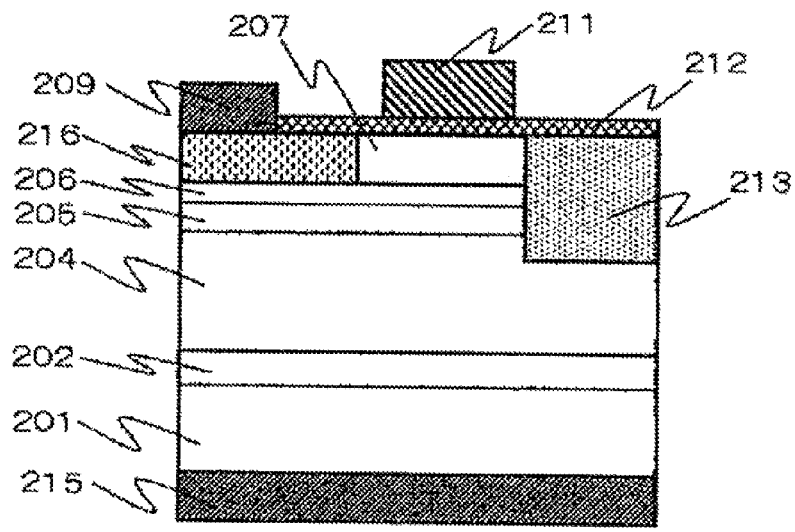
FIG. 7F is a schematic cross sectional view describing a forming process of a drain electrode in the manufacturing process of the field effect transistor according to the first exemplary embodiment of the present invention.

After the diffusion source 217 is etched and removed, using the vapor deposition/liftoff method, Ti/Al (30/180 nm) electrode is formed in the predetermined place on the surface of the source contact domain 216, then the RTA (Rapid Thermal Anneal) is performed at 650 degrees Celsius for 30 seconds to obtain the source electrode 209 (FIG. 7D). Then, by the ALD (Atomic Layer Deposition) method, the gate insulating film 212 comprising $Al_2O_3$ having the thickness of 50 nm is formed. Then, using the vapor deposition/liftoff method, the gate electrode 211 is obtained by forming Pt/Au (20/400 nm) in the predetermined place (FIG. 7E). Finally the field effect transistor is completed after the polishing back surface of the substrate 201 to attain thickness of 150 μm and then forming the drain electrode 215 by the vapor deposition method on the back surfaces of the substrate 201 (FIG. 7F).

Hereinafter, the operation of the field effect transistor of the constitution of FIG. 6 according to the second embodiment of the present invention is described.

The structure below the gate electrode 211 is similar to that of the first exemplary embodiment, although there is some difference in terms of the film thickness or Al composition. Thus, the energy potential distributions are respectively when the bias voltage is not applied to the gate electrode 211 (Vg=0V) and the positive bias voltage that is equal to or higher than the predetermined threshold voltage (Vt) is applied (Vg>Vt>0V) the same to those shown in FIG. 3 and FIG. 4. That is, when the bias voltage is not applied to the gate electrode 211 (Vg=0V), there is no electron generated that functions as the carrier in the channel layer 207, and the field effect transistor is in the off state. Only when the positive bias voltage that is equal to or higher than the predetermined threshold voltage (Vt) is applied (Vg>Vt>0V), the electron that functions as the carrier is generated and the field effect transistor is in the on state. Thus, the field effect transistor of the constitution of FIG. 6 functions as the field effect transistor of the normally-off type.

Also, the field effect transistor of FIG. 6 also functions as the vertical field effect transistor in which the flow of electrons (current) is vertical from the source electrode 209 of the front surface to the drain electrode 215 of the back surface in the ON state. The channel resistance is reduced by the two-dimensional electron gas being generated at the interface between the channel layer 207 and the electron supply layer 206 in addition to the inversion distribution layer generated at the interface between the channel layer 207 and the gate insulating film 212 in the region below the gate electrode 211. Since the flow of electrons (current) spreads laterally, through the two-dimensional electron gas generated at the interface between the barrier layer 205 and the drift layer 204, the resistance of the drift region can be reduced. In this point as well, the similar effect as in the first exemplary embodiment is provided.

Then, in the field effect transistor of FIG. 6, a source contact domain 216 to which a large quantity of n-type dopant (Si) is added is formed solid layer diffusion without using a source contact layer comprising AlGaN as in the first exemplary embodiment as a domain to form the source electrode 209. Accordingly, doping of high density of $10^{20}$ $cm^{-3}$ or more is facilitated, uneven distribution is obtained in which the dopant density is higher in the front surface, and the source electrode 209 can be formed on the GaN surface, not in AlGaN, whereby the contact resistance of the source electrode 209 can be greatly reduced in comparison with the first exemplary embodiment. Although the solid layer diffusion method is used to form the source contact domain 216 in the present embodiment, it goes without saying that the source contact domain 216 may be formed using other techniques such as the ion implantation method.

Also, in the field effect transistor of FIG. 6, the n$^+$type connection region 213 is formed of n$^+$type GaN using selection growth without using the ion implantation method as in the first exemplary embodiment. In the first exemplary embodiment, while the n-type dopant of the high density is added into the n$^+$type connection region 113, the interface between the channel layer 107 and the electron supply layer 106, and the interface between the barrier layer 105 and the drift layer 104 are formed in AlGaN/GaN heterojunction. Thus there is a potential barrier corresponding to the conduction band discontinuity (Δ EC), which causes increase in the resistance. In contrast, because the whole n$^+$type connection region 213 is formed of n$^+$type GaN and heterojunction is not included in the second embodiment, whereby the resistance of this domain can be reduced.

Moreover, in the field effect transistor of FIG. 6, the trench ditch from the backsurface of the substrate 201 and the drain contact layer are not used to form the drain electrode 215. Such a constitution is possible by using a conductive substrate such as n-type Si and n-type SiC as the substrate 201, and using the buffer layer 202 that connects the substrate 201 and the drift layer 204 by relatively low resistance. Particularly, the cost of the substrate when using the n-type Si as the substrate 201 is 1/10 or less compared with SiC, sapphire, and GaN which are generally used as a substrate of a nitride-based semiconductor device, resulting in substantial decrease in the manufacturing cost of the device. Furthermore, the yield declines by a crack caused in a device chip during or after the production because the strength decreases in a trench groove in the configuration that uses the trench ditch as in the first exemplary embodiment; however, such a problem does not occur in the second embodiment in which the trench ditch is not used.

Further, the drain electrode 115 is formed to the drain contact layer 103 comprising GaN which is a wide gap semiconductor in the trench ditch in the constitution using the trench ditch as in the first exemplary embodiment; however, the drain electrode 215 is formed to n-type Si when using n-type Si as the substrate 201 in the second embodiment, whereby the contact resistance that is lower than that of the first exemplary embodiment can be achieved easily.

As described above, the second embodiment has the configuration suitable to achieve lower On resistance. Further, in the present embodiment, the n-type dopant is added to the drift layer 204 to reduce On resistance, resulting in extremely low On resistance as 0.5 mΩcm$^2$ with respect to the pressure resistance of 200 V, which ensures that the field effect transistor of the present invention is suitable for the production of products with low withstand pressure.

Two exemplary embodiments were shown as above to describe the constitution of the field effect transistor according to the present invention. Regarding the constitution of each part, a plurality of structures or production methods are disclosed as described below.

Source electrode: It is formed on a channel layer through a source contact layer comprising AlGaN. Alternatively, it is formed through a source contact domain where n-type impurities are doped in a part of the front surface of the channel layer.

N$^+$type connection region: By an ion implantation method or a solid layer diffusion method, n-type dopant is added. Alternatively, selection growth of n$^+$type GaN is done.

Drain electrode: It contacts with a drain contact layer through a trench ditch from the backs surface of the substrate. Alternatively, it contacts with the back surface of the substrate using a conductive substrate and a low resistance buffer.

Regarding these parts, one of the configuration is selected in two exemplary embodiments. However, the combination is not limited to two exemplary embodiments disclosed above, but normally-off (enhancement) type field effect transistor using a nitride semiconductor that achieves low power consumption with low On resistance, which is the object of the invention, can be formed with any combination.

The present invention was described with reference to the exemplary embodiments as above, but the present invention is not limited to the exemplary embodiments described above. Various changes that can be understood by those skilled in the art can be made to the configuration and detailed part of the present invention within the scope of the present invention.

This application claims the benefit of priority, and incorporates herein by reference in its entirety, the following Japanese Patent Application No. 2008-53115 filed on Mar. 4, 2008.

INDUSTRIAL APPLICABILITY

A normally-off (enhancement) type field effect transistor using a nitride semiconductor according to the present invention has low ON resistance and the structure to reduce power consumption. With these advantageous points, the transistor may be applied as a transistor that forms a high power microwave amplifier used in a base station of cell-phones or a satellite communication system, or a transistor which is used in power control devices such as a power supply of a PC or a power steering of an automobile.

The invention claimed is:

1. A field effect transistor, comprising:
a nitride-based semiconductor multilayer structure, at least including, a drift layer formed of n-type or i-type $Al_xGa_{1-x}N (0 \leq X \leq 0.3)$, a barrier layer formed of i-type $Al_yGa_{1-y}N$ (Y>X), an electron supply layer formed of n-type $Al_yGa_{1-y}N$, and a channel layer formed of i-type GaN or InGaN, that are epitaxially grown on a substrate in this order, from a side of the substrate, a suitable buffer layer being interposed between the substrate and the nitride-based semiconductor multilayer structure;
a gate electrode formed in a part of a front surface of the channel layer with an insulating film interposed therebetween;
an n$^+$type connection region in which n-type impurities are doped with the density of $1 \times 10^{18}$ cm$^{-3}$ or more, in a range from at least a part of a channel layer to a part of the drift layer, adjacent to one side in a planer direction of an area where the gate electrode is formed;
a source electrode formed on a front surface of the nitride-based semiconductor multilayer structure in the opposite side of the n$^+$type connection region with respect to the gate electrode; and
a drain electrode formed on a back surface of the substrate.

2. The field effect transistor according to claim 1, wherein the source electrode is formed on a source contact domain, the source contact region being formed by doping n-type impurities with the density of $1 \times 10^{18}$ cm$^{-3}$ or more to a part of the front surface of the channel layer.

3. The field effect transistor according to claim 1, wherein the source electrode is formed on a source contact layer formed of n-type or i-type $Al_zGa_{1-z}N$ (Z>Y) formed on the front surface of the channel layer.

4. The field effect transistor according to claim 1, wherein the whole area of the n$^+$type connection region is formed of GaN where n-type impurities are doped with the density of $1 \times 10^{18}$ cm$^{-3}$ or more.

5. The field effect transistor according to claim 1, wherein the drain electrode is formed to contact the nitride-based semiconductor multilayer structure in a trench ditch which is formed to reach the nitride-based semiconductor multilayer structure from the back surface of the substrate.

6. The field effect transistor according to claim 2, wherein the whole area of the n$^+$type connection region is formed of GaN where n-type impurities are doped with the density of $1 \times 10^{18}$ cm$^{-3}$ or more.

7. The field effect transistor according to claim 3, wherein the whole area of the n$^+$type connection region is formed of GaN where n-type impurities are doped with the density of $1 \times 10^{18}$ cm$^{-3}$ or more.

8. The field effect transistor according to claim 2, wherein the drain electrode is formed to contact the nitride-based semiconductor multilayer structure in a trench ditch which is formed to reach the nitride-based semiconductor multilayer structure from the back surface of the substrate.

9. The field effect transistor according to claim 3, wherein the drain electrode is formed to contact the nitride-based semiconductor multilayer structure in a trench ditch which is formed to reach the nitride-based semiconductor multilayer structure from the back surface of the substrate.

10. The field effect transistor according to claim 4, wherein the drain electrode is formed to contact the nitride-based semiconductor multilayer structure in a trench ditch which is formed to reach the nitride-based semiconductor multilayer structure from the back surface of the substrate.

11. A method of mean manufacturing a field effect transistor, comprising:
forming a nitride-based semiconductor multilayer structure by epitaxially growing, on a substrate, at least a drift layer formed of n-type or i-type $Al_xGa_{1-x}N (0 \leq X \leq 0.3)$, a barrier layer formed of i-type $Al_yGa_{1-y}N(Y>X)$, an electron supply layer formed of n-type $Al_yGa_{1-y}N$, and a channel layer formed of i-type GaN or InGaN, in this order, from a side of the substrate, a suitable buffer layer being interposed between the substrate and the nitride-based semiconductor multilayer structure;
forming a gate electrode in a part of a front surface of the channel layer with an insulating film interposed therebetween;
forming an n$^+$type connection region in which n-type impurities are doped with the density of $1 \times 10^{18}$ cm$^{-3}$ or more, in a range from at least a part of the channel layer to a part of the drift layer, adjacent to one side in a planer direction of an area where the gate electrode is formed;
forming a source electrode on a front surface of the nitride-based semiconductor multilayer structure in the opposite side of the n$^+$type connection region with respect to the gate electrode; and
forming a drain electrode on a back surface of the substrate.

* * * * *